(12) United States Patent
Fuentes

(10) Patent No.: US 9,011,064 B2
(45) Date of Patent: Apr. 21, 2015

(54) DEVICE AND METHOD FOR HOLDING A SUBSTRATE

(75) Inventor: Ricardo I. Fuentes, Hopewell Junction, NY (US)

(73) Assignee: Materials and Technologies Corporation, Poughkeepsie, NY (US)

( * ) Notice: Subject to any disclaimer, the term of this patent is extended or adjusted under 35 U.S.C. 154(b) by 2072 days.

(21) Appl. No.: 11/603,571

(22) Filed: Nov. 22, 2006

(65) Prior Publication Data

US 2007/0116551 A1    May 24, 2007

Related U.S. Application Data

(60) Provisional application No. 60/739,128, filed on Nov. 23, 2005.

(51) Int. Cl.
*H01L 21/677* (2006.01)
*H01L 21/687* (2006.01)
*H01L 21/67* (2006.01)

(52) U.S. Cl.
CPC .... *H01L 21/68728* (2013.01); *H01L 21/67023* (2013.01)

(58) Field of Classification Search
None
See application file for complete search history.

(56) References Cited

U.S. PATENT DOCUMENTS

| 5,669,977 A | 9/1997 | Shufflebotham |
| 2002/0017456 A1 | 2/2002 | Graham et al. |
| 2005/0090093 A1 | 4/2005 | Bailey et al. |

FOREIGN PATENT DOCUMENTS

| JP | H09-107023 | 10/1995 |
| JP | 2001 110771 | 4/2001 |
| JP | 2003-197718 | 7/2003 |
| WO | WO 99/17344 | 4/1999 |

OTHER PUBLICATIONS

PCT International Search Report and Written Opinion from PCT/US06/45353, mailed Sep. 24, 2007.
European Search Report from European Patent Application No. 06838362.9, mailed Oct. 5, 2011.

*Primary Examiner* — Eric Golightly
(74) *Attorney, Agent, or Firm* — Kenyon & Kenyon LLP

(57) ABSTRACT

A device and method for holding a substrate, e.g., a semiconductor wafer, during a process, e.g., a liquid meniscus process, the substrate having a first side and a second side. The device includes one or more holding components, e.g., fingers, configured to contact a second side of the substrate without significantly contacting the first side of the substrate. At least one of the holding components may be configured to be moved during the process so as to prevent the at least one holding components from effecting the process, e.g., contacting the liquid meniscus. Such an arrangement may be employed when the substrate includes a top side having at least one structure or feature thereon, it being desirable that the holding components avoid contact with the structures or features during the process.

12 Claims, 5 Drawing Sheets

DEVICE AND METHOD FOR HOLDING A SUBSTRATE

RELATED APPLICATIONS

This application is based on, and claims the benefit of priority to, Applicant's co-pending U.S. Provisional Patent Application No. 60/739,128, filed Nov. 23, 2005, the disclosure of which is hereby fully incorporated by reference.

FIELD OF INVENTION

This invention relates to devices and methods for holding a substrate, and more particularly to devices and methods for holding a substrate, e.g., from above, with minimal mechanical contact.

BACKGROUND

There are a great variety of chucks that are conventionally known, including so-called "non-contact" chucks. Generally, a non-contact chuck makes little or no mechanical contact with a first, e.g., a non-process, surface of a substrate to be held. A popular type of non-contact chuck is the so-called Bernoulli type.

Such chucks operate to lift a substrate, e.g., which may include and is often referred to herein as a wafer, above a surface by introducing a current of gas underneath and most often rotate the wafer simultaneously. Such chucks operate with a second, e.g., process, side facing upwards. This may be a poor arrangement in situations where face-down applications call for holding the wafer with its side to be processed facing down.

There are other conventional non-contact types of chucks that can operate facing down, but these suffer from instability and often draw chemicals and/or contaminants onto the second or backside, e.g., non-process side, of the substrate.

SUMMARY OF INVENTION

The present invention, according to various embodiments thereof, relates to a device to hold substrates from above with minimal mechanical contact. Advantageously, the device can hold a substrate without mechanical contact to the top surface and minimal contact with the bottom surface. Furthermore, the device includes holding components (also referred to herein as "fingers") for holding the substrate, the fingers being retractable in a prescribed manner to allow a variety of processes to occur on the bottom surface of the substrate. Said fingers can make contact with the sides and bottom of the substrate, as well as sides only, bottom only and/or a combination therein, as well as, in some embodiments, make minimal contact with a portion of the second (backside) surface too.

The device of the present invention, according to various embodiments thereof, may be employed to hold a substrate from above, the device doing so either by itself or in conjunction with a processing apparatus or set up to allow contact or exposure of the bottom of the wafer to a process, medium, liquid, gas, spray, among other types of exposures, without contacting, or making minimal contact with, the "non-process" side of the substrate.

In an embodiment, the device may hold a semiconductor, glass, or device wafer—of any kind—such as to expose its underside to a process—of any suitable kind—while avoiding substantial contact (e.g., non-contact) with the non-process side. Even though this device is useful on its own or while incorporated in a variety of systems, tools, or apparatuses, it is particularly useful in conjunction with an apparatus described in U.S. patent application Ser. No. 09/675,029 entitled WET PROCESSING USING A FLUID MENISCUS, APPARATUS AND METHOD, now issued as U.S. Pat. No. 7,122,126, the disclosure of which is incorporated by reference herein in its entirety.

In an embodiment, the present invention relates to a device and method for holding a substrate, e.g., a semiconductor wafer, during a process, e.g., a liquid meniscus process, the substrate having a first side and a second side. The device includes one or more holding components, e.g., fingers, configured to contact a second side of the substrate without contacting, or making minimal contact with, the first side of the substrate. In an embodiment, at least one of the holding components is configured to be moved during the process so as to prevent the at least one holding components from effecting the process, e.g., contacting the liquid meniscus in the case of the arrangement described in the above-referenced application. Such an arrangement may be employed when the substrate includes a top side having at least one structure or feature thereon, it being desirable that the holding components avoid contact with the structures or features during the process or simply to prevent the top, e.g., non-process, surface from being exposed to the process.

In another embodiment, the present invention relates to a method for processing a substrate, the substrate having a first side and a second side. The method comprises the steps of: holding the substrate via one or more holding components that are configured to contact the second side of the substrate without contacting the first side of the substrate; moving at least one of the substrate and a process element such that the substrate and a process element move relative to each other. In an embodiment, the method further comprises the step of moving at least one of the holding components during the process so as to prevent the at least one holding components from contacting the process element.

DETAILED DESCRIPTION

As set forth above, the present invention relates to a device for holding, e.g., a substrate. An embodiment of the present invention includes a chuck for holding a substrate during wet processing, as described above. In this particular application, the device of the present invention may retract one or more of its fingers in a motion pattern compatible with said wet processing apparatus operation. For example, as the substrate being held by the device of the present invention is scanned over the fluid reservoir, the fingers passing over the fluid—or in the proximity thereof—may be retracted away from the fluid in such a manner to avoid contact with it. One such process may employ a harmonic drive where a "wave" of any or arbitrary shape and periodicity propagates back and forth as the chuck moves over the fluid, in such a way as to be retracted (the fully retracted position can be associated with the crest of the driving wave, for example) when it is directly over it. In addition or alternatively, there are also other positions or movements that the chuck's fingers may assume as the process proceeds or during different processes, depending on the particular application and desired effect. One such position or movement is to, e.g., alternate a number of fingers being in an "on" position (e.g., in contact with and holding the substrate) with other fingers in an "off" position (e.g., retracted so as to be out of contact with and not holding the substrate). These positions and movements, e.g., also referred to as states or driving modes, are just some of many such possible positions and movements, such as all fingers being in an "on" position (e.g., full chucking) and all fingers being in an "off" position (e.g., un-chucked), all such possible positions and movements being subjects of the present invention.

The holding components, e.g., fingers, can be made or arranged to contact the wafer on the sides of the wafer, on the bottom of the wafer (e.g., the process side), on a small portion of the top, or a combination of these. Advantageously, any significant contact of the chuck surface, fingers, or any other components of the device is avoided with the top (e.g., non-process) surface of the wafer. Thus, the holding device of the present invention, according to various embodiments, can hold substrates face-down without risking damage to the top (e.g., non-process) surface, its features, or any other structures deposited or fabricated thereon. In an embodiment, the top (e.g., non-process) surface can be kept away from the chuck's own surface by a wide range of distances, from a few micrometers to a few millimeters. Larger or smaller distances are also possible and contemplated in this invention. Furthermore, the present invention is intended to apply to substrates of any shape, thickness or material.

Figure 1A:
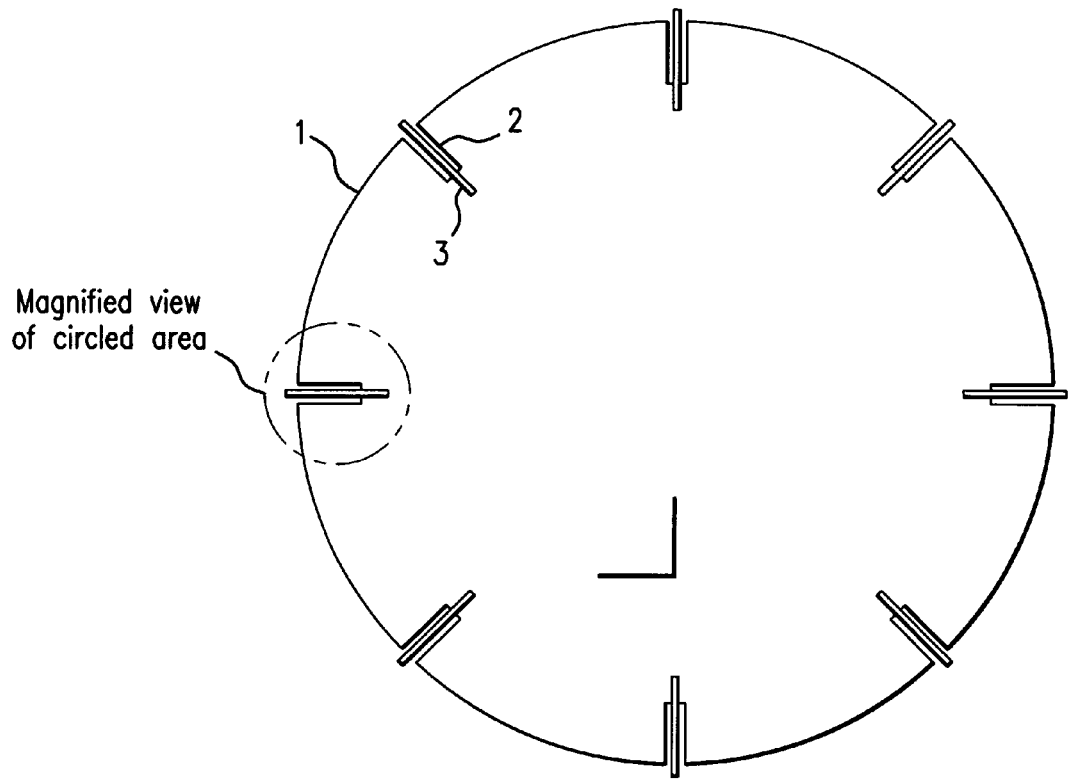
FIG. 1(a) is a top view of a holding device, according to an embodiment of the present invention.
Figure 1B:
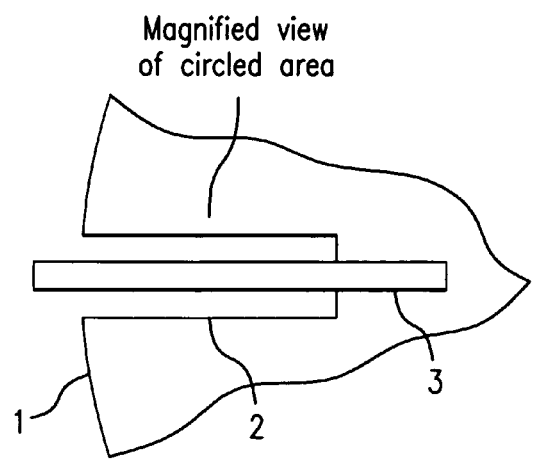
FIG. 1(b) is a magnified view of a region of the holding device shown in FIG. 1(a)

FIG. 1(a) is a top view of a holding device, according to an embodiment of the present invention, while FIG. 1(b) is a magnified view of a region of the holding device shown in FIG. 1(a). FIGS. 1(a) and 1(b) show a chuck plate 1 providing the mounting base for fingers 2 which are configured to be moveable, e.g., to swing in and out through, slits 3 at the edges of the plate 1. The plate 1, fingers 2 and other components of the chuck can be made of any suitable materials depending on the task for which it will be used and environment in which it will be used.

Figure 2A:
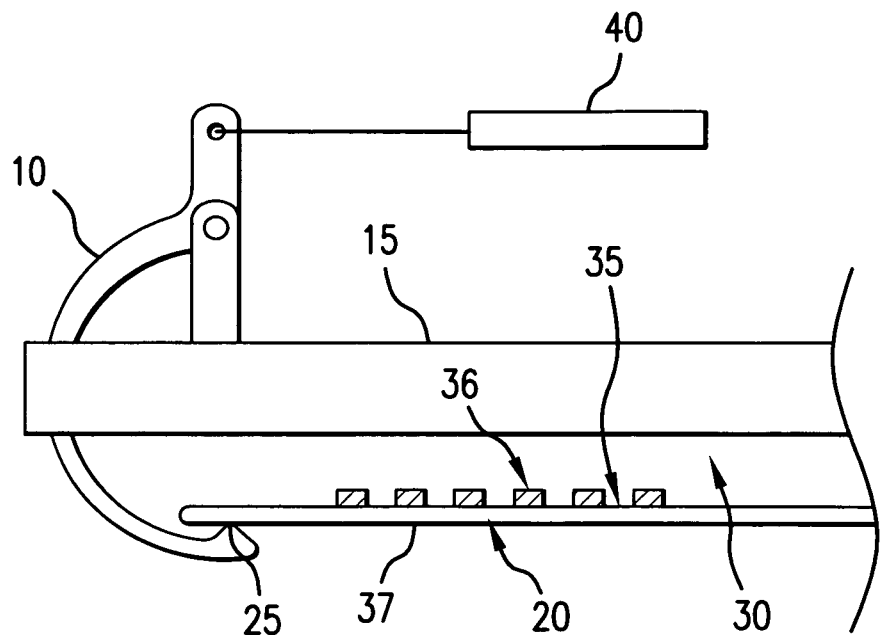
FIG. 2(a) is a partial side cross-sectional view of a holding device showing a finger in a first or holding position, according to an embodiment of the present invention.
Figure 2B:
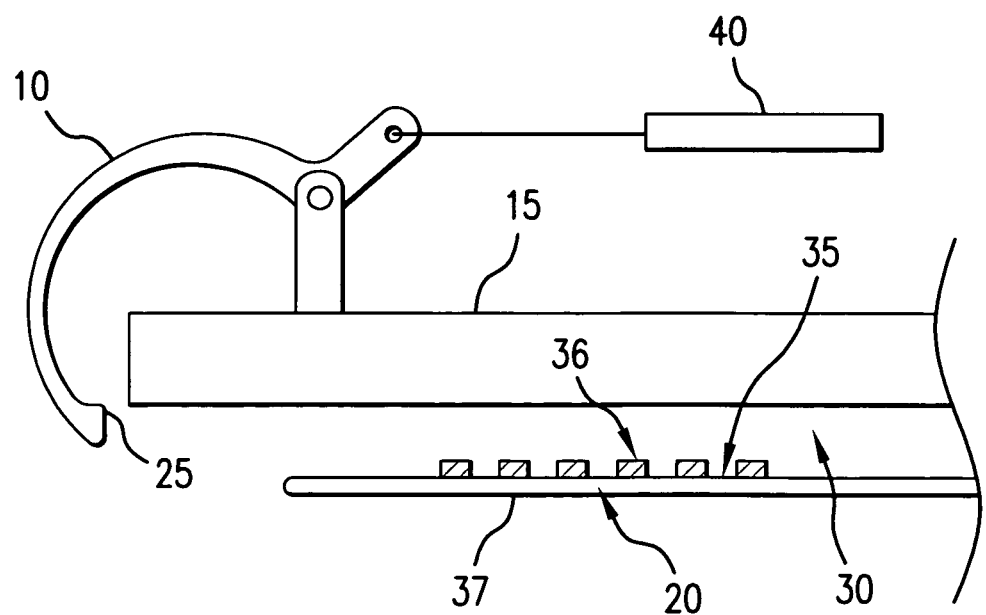
FIG. 2(b) is a partial side cross-sectional view of a holding device showing the finger in a second or retracted position, according to an embodiment of the present invention.

FIGS. 2(a) and 2(b) are partial side cross-sectional views of a holding device, with FIG. 2(a) showing a finger 10 in a first or holding position, e.g., holding or supporting a substrate 20, and FIG. 2(a) showing the finger 10 in a second or retracted position, e.g., spaced away from so as not to hold or support the substrate 20. The fingers 10 may have any shape, but advantageously has a shape that enables it to be, when in a holding position, in a plane underneath a substrate to be held, as shown in FIG. 2(a), and to be, when in a retracted position, out of the plane just underneath the substrate being held 20, as shown in FIG. 2(b). The movement of the finger 10 is operated by an actuator 40. The substrate 20 may have a first, e.g., non-process, side 35 and a second, e.g., process, side 37. The first, e.g., non-process, side 35 may have delicate structures or features 36 that are desired not to be disturbed by mechanical contact. These structures or features 36 may, in various embodiments of the present invention, be spared from contact with any part of the holding device by a gap 30 between the chuck plate 15 and the first, e.g., non-process, side 35 of the substrate 20. In the embodiment shown, contact between the fingers 10 and the second, e.g., process, side 37 of the substrate 20 is made by a sharp tip 25 on the end of the finger 10, which minimizes the contact area and also minimizes any capillary entrapment of process fluid that may take place in the event of incidental contact between the process fluid and a finger 10. To further protect the top, e.g., non-process, side of the substrate, a gas or fluid may be circulated in the gap, around the periphery, or in any combination of suitable pathways.

Figure 3A:
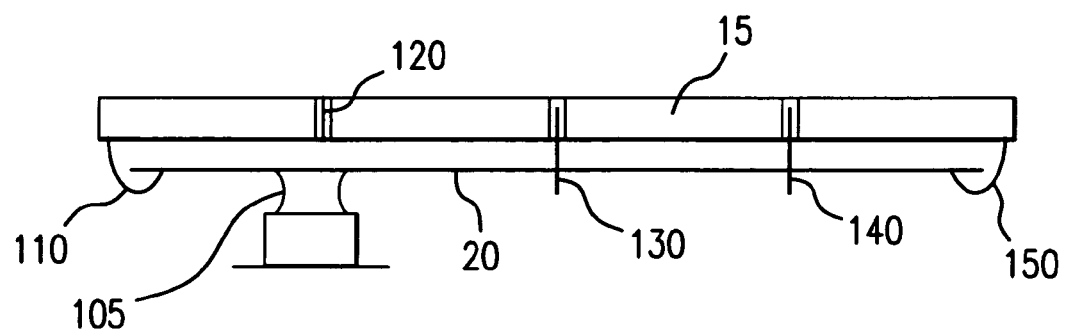
FIGS. 3(a) and 3(b) illustrate an exemplary process by which fingers of the holding device may be moved during operation, according to an embodiment of the present invention.
Figure 3B:
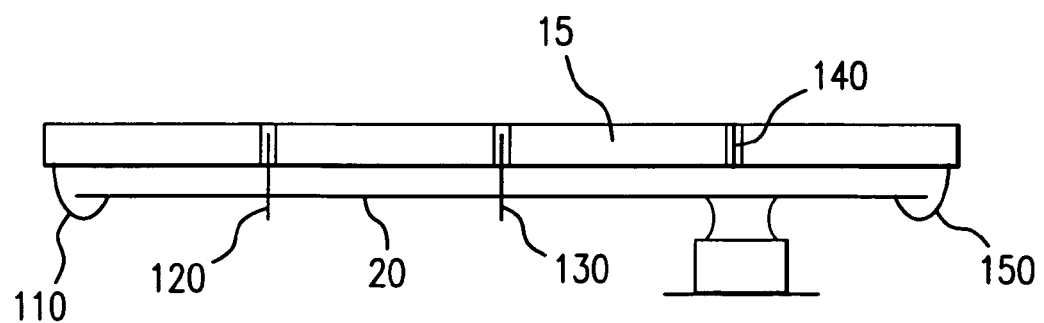

In an embodiment, the fingers 10 are able to move away from the first, e.g., process, side of the substrate 20 as the substrate 20 is moved, e.g., scanned, over a fluid meniscus such as described in Applicant's co-pending U.S. patent application Ser. No. 09/675,029 entitled WET PROCESSING USING A FLUID MENISCUS, APPARATUS AND METHOD, now issued as U.S. Pat. No. 7,122,126. FIGS. 3(a) and 3(b) illustrate an exemplary process by which fingers of the holding device may be moved during operation. Referring to FIG. 3(a), a substrate 20 is held by various fingers 110, 120, 130, 140, 150 of a chuck plate 15. As the substrate 20 and a liquid meniscus 105 are moved relative to each other (it should be recognized that either one and/or both of the substrate 20 and the liquid meniscus 105 may be moving), a particular region of the substrate 20 approaches the liquid meniscus 105. Consequently, an appropriate finger or fingers, in this case finger 120, is retracted so that the finger will not contact or otherwise effect the liquid meniscus 105. The other fingers 110, 130, 140, 150 remain supporting the substrate 20. Referring now to FIG. 3(b), as the substrate 20 and a liquid meniscus 105 are continued to be moved relative to each other (again, it should be recognized that either one and/or both of the substrate 20 and the liquid meniscus 105 may be moving), a different region of the substrate 20 approaches the liquid meniscus 105. Consequently, a different finger or fingers, in this case finger 140, is retracted so that the finger will not contact or otherwise effect the liquid meniscus 105. The finger 120 has been returned to its holding position. In addition, the other fingers 110, 130, 150 remain in their holding positions supporting the substrate 20. Of course, it should be recognized that the movements of the various fingers into and out of their respective retracted positions may follow many conceivable patterns depending on many different factors, e.g., the size and shape of the meniscus, the size and shape of the substrate, the movements of the substrate and/or the liquid meniscus relative to each other, the speed at which the process is performed, etc., and as such they are all considered to be part of the present invention.

For example, in an embodiment of the present invention, the fingers may be successively moved into and out of their respective retracted positions so as to move in a wave-like motion, e.g., with a node, crest or valley positioned over or in the vicinity of the fluid channel. In following such a motion, a finger may start to retract when the substrate approaches the liquid channel, reach its fully retracted position when approximately over the liquid channel, and move back into contact with the first, e.g., process, side of the substrate after the finger has passed over the liquid channel. In such an embodiment, the wavelength and its periodicity of the wave-like motion can be varied according to the process requirements as well as details of its shape. Again, there is no limitations to the motion that may be employed (other than, e.g., the process parameters) and any and all types of motion patterns are also considered to be part of the present invention.

Figure 4:
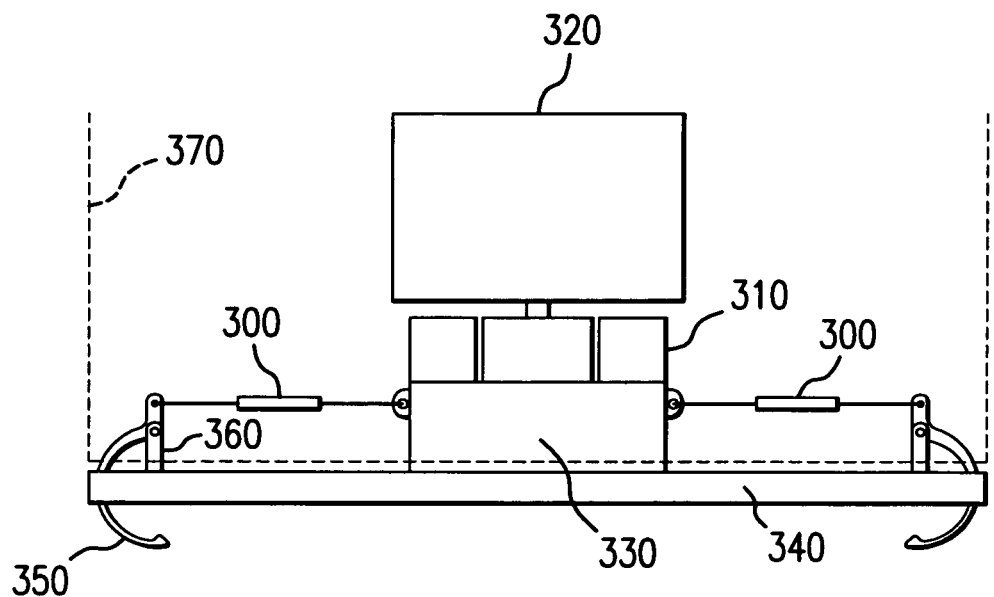
FIG. 4 is a side view of a holding device, according to an embodiment of the present invention.

FIG. 4 is a side view of a holding device, according to an embodiment of the present invention. In this embodiment, a chuck mounting plate 340 has finger mountings 360 attached thereto. Fingers 350 are themselves mounted to the finger mountings 360. The fingers 350 and/or the finger mountings 360 are attached or otherwise coupled to respective actuators 300. The actuators 300 are coupled to a hub 330 which, depending on the type of actuator 300 employed, may provide air pressure, vacuum, electrical power, signals, or any other input or output that may be employed so as to operate the actuators 300 for moving the fingers 350. The hub 330 may in turn be mounted to a shaft or motor 320, or in some other suitable arrangement to a "head" 370 that then may mount to a tool or apparatus suitable for the process or application. The hub 330 can be fitted with a rotatory feedthru 310 to provide power or signals to the hub 330 as it rotates, if such a feature is implemented. Depending on the process, any type of actuator suitable for moving one or more of the components, e.g., the fingers, of the holding device may be employed, e.g., pneumatic, piezoelectric, electro restrictive, electromagnetic, motors, shape memory alloys, etc. Many other mechanical arrangements as to the design of the internal parts are conceivable and are all considered to be subjects of the present invention, including but not limited to the direct actuation of the fingers by any type of suitable actuator.

Figure 5:
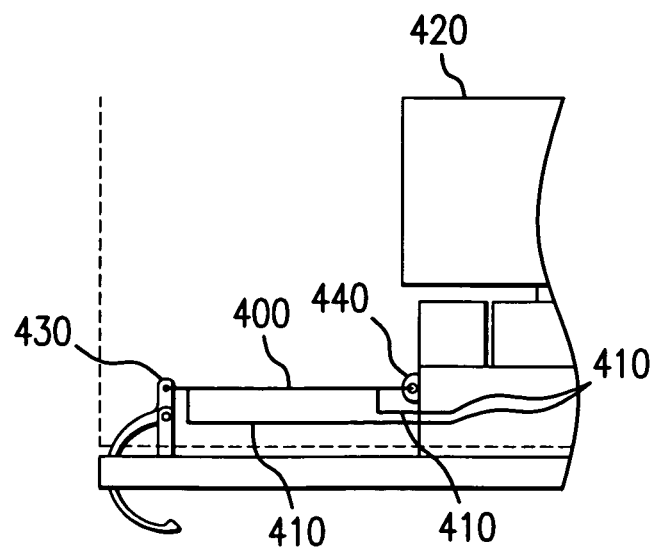
FIG. 5 is a partial side view of a holding device, according to an embodiment of the present invention.

FIG. 5 is a partial side view of a holding device, according to an embodiment of the present invention. In this embodiment, a shape memory alloys (also known as "muscle wires" as well as by other trade names) is employed as the actuator. Shape memory alloys may be employed because of their high force-to-volume ratio, compactness, simplicity, and response time. In this embodiment, a piece of shape memory alloy 400 (in this case having the shape of a wire but alternatively having a different shape, e.g., a rod, etc.) is attached at its one end 430 to a finger and at its other end 440 to a hub 420. To move the finger, an electrical current is applied to the shape memory alloy wire 400 via electrical conductors 410 attached to a portion of the shape memory alloy wire 400. The current heats up the wire 400 and thus causes it to change dimensions, thereby moving the finger. A desired range of motion may be achieved by varying the finger mounting 430, e.g., a lever arm, connecting the finger and the actuator. Similarly, any suitable type of actuator can be used either additionally or alternatively for the above-described arrangement, such as pneumatic, electric, piezoelectric, piezoresistive, magentic, among others.

Figure 6A:
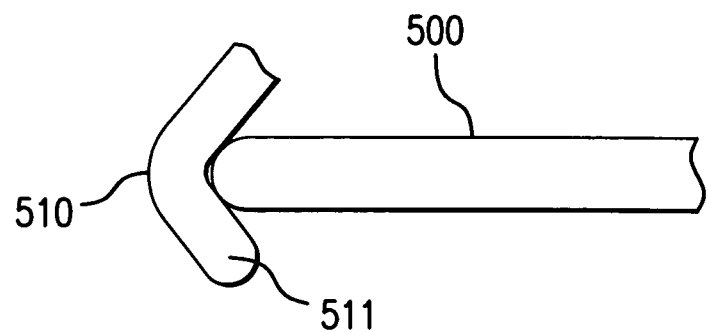
FIG. 6(a) illustrates a side contact finger, according to an embodiment of the present invention.
Figure 6B:
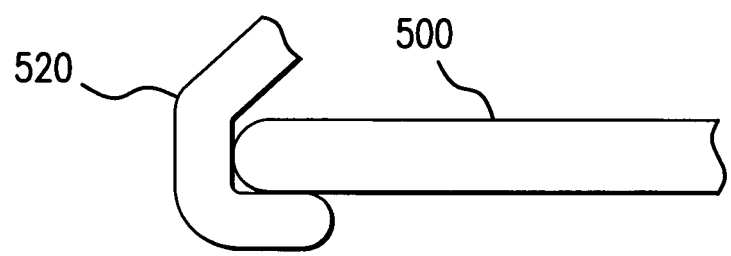
FIG. 6(b) illustrates a side and bottom contact finger, according to another embodiment of the present invention.
Figure 6C:
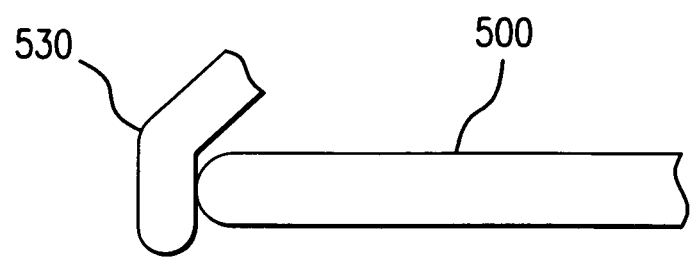
FIG. 6(c) illustrates a side-only contact finger, according to still another embodiment of the present invention.

It should be recognized that the fingers may be of varying shapes, depending on a variety of factors such as desired place of contact, desired area of contact, number of desired contact points, substrate shape, substrate stiffness, substrate thickness, among many other factors. A few such shapes are illustrated in FIGS. 6(a) through 6(c). For example, FIG. 6(a) illustrates, according to an embodiment of the present invention, a side contact finger 510 that contacts a substrate 500 mostly or exclusively on the sides of the substrate 500 (the side referring to the outermost circumferential surface of the substrate 500) and that includes a region 511 that is situated below the substrate 500. FIG. 6(b) illustrates, according to another embodiment of the present invention, a side and bottom contact finger 520 that contacts a substrate 500 on both its side and bottom, e.g., the non-process side. FIG. 6(c) on the other hand illustrates, according to still another embodiment of the present invention, a side-only contact finger 530 that contacts the substrate 500 on its side without contacting any other point of the substrate. Many other configurations, shapes, contact schemes, and combinations thereof, can be conceived and are all considered to be a part of the present invention.

The devices and methods for holding substrates, according to the various embodiments of the present invention, may have many different applications. Even though a large number of possible applications are conceivable, in a particular embodiment of the present invention, there is provided, in stark contrast with conventional substrate-holding devices, an effective device and method to hold a substrate such that a process side of the substrate is facing down. This is particularly advantageous in wet processing applications in which a second, e.g., process, side is exposed to a liquid which is often times corrosive, and in which a first, e.g., non-process, side is desired to not be exposed to the liquid.

The devices and methods described herein may be particularly beneficial to various state of the art applications currently being employed. For example, the wet processing apparatus and methods described in U.S. patent application Ser. No. 09/675,029 entitled WET PROCESSING USING A FLUID MENISCUS, APPARATUS AND METHOD, now issued as U.S. Pat. No. 7,122,126, may benefit greatly from this invention. Other processes that employ similar face-down arrangements may likewise benefit.

The devices and methods of the present invention may also be used advantageously to process substrates that, because of the fragile nature of features on a particular surface, e.g., its front face or non-process surface, should avoid mechanical contact with said features. Such substrates encompass an ever growing category of devices, such as MEMS, optoelectronic, memory, solar cells, CMOS, and others. The processing of such substrates has challenged the substrate-handling capabilities of conventional devices, as the use of such conventional devices has often led to contamination, breakage, low yields, or simply the impossibility of performing certain critical steps in the manufacture of such devices.

The devices and methods of the present invention may also be used advantageously to process substrates with inordinately large features on its front, e.g., non-process, surface. Such inordinately large features have prevented handling of certain substrates by conventional non-contact chucks. Bumped wafers are one such growing category of substrates. Furthermore, the devices and methods of the present invention may allow for the processing of substrates with inordinately delicate features on its front, e.g., non-process, surface, the processing of which is unsuitable with conventional non-contact chucks. MEMS substrates are one such growing category.

The devices of the present invention may be employed in the processing or handling of any type of material, e.g., any and all solids and semisolids, and any other material, composite, aggregate or material form that can be held by any arrangement of the present invention.

It should be recognized that the present invention, in accordance with various embodiments thereof, may include any one or more of the above-referenced devices and methods, for whatever purpose used, and further includes any other application resulting from combinations, extensions, or adaptations of the above. Many embodiments, variations and combinations are conceivable, and are considered to be part of the present invention. For example, the devices and methods of the present invention may be employed using any suitable material or materials combinations. Furthermore, the devices and methods of the present invention may be employed using any suitable manufacturing process or sequence of processes. Still further, the devices and methods of the present invention may be employed using components of, e.g., a different shape, manner, materials, geometry or form, irrespective of whether such components have substantially the same purpose and/or whether the device is operated using substantially the same operation principles. Also, the devices and methods of the present invention may be employed using fingers or holding devices that are moved in different patterns or manners as those described herein, including the case of no motion at all. For example, the whole device or any portion thereof may rotate, translate, move up and/or down, or perform motions that comprise a combination including some or all of these motions. In addition, the devices and methods of the present invention may be incorporated into a larger subsystem or apparatus to perform other processes where the subject of the invention holds a substrate or may be used as a stand alone device. Also, the devices and methods of the present invention may be employed for other applications not explicitly described herein. The general case where the finger motion itself causes a motion, e.g., rotational, translation or any combination thereof, of the substrate is also considered to be subject of the present invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A device for holding a substrate during processing of the substrate, the substrate having a first side and a second side, the device comprising:
    a plurality of holding components each movable from a respective first predetermined position in which the respective holding component is configured to contact a second side of the substrate without significantly contacting the first side of the substrate to a respective second predetermined position,
    wherein the device is configured to selectably actuate at least one of the holding components from its respective first predetermined position to its respective second predetermined position during the processing of the substrate while other holding components remain in contact with the substrate so as to prevent the at least one of the holding components from affecting the processing of the substrate.

2. The device of claim 1, wherein the substrate is a wafer.

3. The device of claim 2, wherein the wafer is a semiconductor wafer.

4. The device of claim 1, wherein the first side is a top side.

5. The device of claim 4, wherein the top side has at least one structure or feature thereon, the one or more holding components avoiding contact with the structures or features during the processing of the substrate.

6. The device of claim 1, wherein the second side is a bottom side, the bottom side being subjected to the processing of the substrate.

7. The device of claim 1, wherein the processing of the substrate is a meniscus process in which a liquid meniscus contacts the bottom side of the substrate, the meniscus and the substrate being moved relative to each other so that the meniscus contacts successive portions of the bottom side of the substrate.

8. The device of claim 7, wherein the at least one of the holding components that is configured to be actuated during the meniscus process is moved so as to prevent the at least one of the holding components from contacting the meniscus.

9. The device of claim 7, wherein two or more of the holding components are configured to successively be moved so as to prevent each one of the two or more holding components from contacting the meniscus.

10. The device of claim 1, further comprising an actuator configured to selectably actuate the at least one of the holding components from its respective first predetermined position to its respective second predetermined position during the processing of the substrate while other holding components remain in their respective first predetermined positions in contact with the substrate so as to prevent the at least one of the holding components from affecting the processing of the substrate.

11. The device of claim 10, wherein the actuator is at least one of pneumatic, piezoelectric, electro restrictive, electromagnetic, a motor, and a shape memory alloy.

12. The device of claim 1, wherein the device is configured to selectably actuate the at least one of the holding components back and forth between its respective first and second predetermined positions during the processing of the substrate while the other holding components remain in their respective first positions in contact with the substrate.

* * * * *